US009704903B2

(12) United States Patent
Dutartre

(10) Patent No.: US 9,704,903 B2
(45) Date of Patent: Jul. 11, 2017

(54) FRONT-SIDE IMAGER HAVING A REDUCED DARK CURRENT ON SOI SUBSTRATE

(71) Applicant: STMicroelectronics SA

(72) Inventor: Didier Dutartre, Meylan (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/840,164

(22) Filed: Aug. 31, 2015

(65) Prior Publication Data

US 2016/0118431 A1    Apr. 28, 2016

(30) Foreign Application Priority Data

Oct. 24, 2014    (FR) ...................... 14 60236

(51) Int. Cl.
| | |
|---|---|
| H01L 27/14 | (2006.01) |
| H01L 27/146 | (2006.01) |
| H01L 21/762 | (2006.01) |
| H01L 27/12 | (2006.01) |

(52) U.S. Cl.
CPC .... H01L 27/14629 (2013.01); H01L 21/7624 (2013.01); H01L 27/1203 (2013.01); H01L 27/1462 (2013.01); H01L 27/14643 (2013.01); H01L 27/14689 (2013.01); H01L 27/14621 (2013.01); H01L 27/14627 (2013.01); H01L 27/14685 (2013.01)

(58) Field of Classification Search
CPC ... H01L 27/14; H01L 27/146; H01L 27/1446; H01L 27/14625; H01L 27/14603; H01L 27/14627; H01L 27/1463; H01L 27/14665
USPC .......................... 257/258, 292, 294, 432, 443
See application file for complete search history.

(56) References Cited

U.S. PATENT DOCUMENTS

| | | |
|---|---|---|
| 2002/0070417 A1 | 6/2002 | Kimura et al. |
| 2009/0200627 A1 | 8/2009 | Moon et al. |
| 2012/0199882 A1* | 8/2012 | Shin ................ H01L 27/14607 257/222 |
| 2013/0069130 A1 | 3/2013 | Kakehi |
| 2014/0054737 A1 | 2/2014 | Okino et al. |

FOREIGN PATENT DOCUMENTS

JP    2004071817 A    3/2004

* cited by examiner

*Primary Examiner* — Chuong A Luu
*Assistant Examiner* — Rodolfo D Fortich
(74) *Attorney, Agent, or Firm* — Slater Matsil, LLP

(57) ABSTRACT

A front-side image sensor may include a substrate in a semiconductor material and an active layer in the semiconductor material. The front side image sensor may also include an array of photodiodes formed in the active layer and an insulating layer between the substrate and the active layer.

14 Claims, 1 Drawing Sheet

FRONT-SIDE IMAGER HAVING A REDUCED DARK CURRENT ON SOI SUBSTRATE

TECHNICAL FIELD

This disclosure relates to so-called "front-side" image sensor arrays fabricated in CMOS technology.

BACKGROUND

FIG. 1 is a schematic sectional view of a pixel of a front-side CMOS image sensor. In this figure and the following, the different pixel elements are shown with dimensions chosen to make the figures intelligible and are not drawn to scale. The doping levels of the P-type conductivity zones are shown with shades of gray that are all the darker as the doping levels are high.

The image sensor is formed in an active layer 10, usually of P-type conductivity, having a doping level noted P−. The layer 10 is formed on a substrate 12, often of P-type conductivity. The layer 10 may have a thickness between 3 and 6 microns, while the substrate may have a thickness of 780 microns.

A buried layer 14 of N-type conductivity, close to the upper face of the layer 10, forms a photodiode with the layer 10. As shown, the portion of the layer 10 above the zone 14 may have a higher doping level than the layer 10 to provide a passivation of the top interface. The upper face of the layer 10 carries various elements for controlling the pixel, especially a transfer gate TG. These elements and other metal tracks are embedded in a passivation layer 16.

The pixel may be laterally isolated from its neighboring pixels by trench isolators 18, typically including semiconductor oxide, which extend throughout the thickness of the active layer 10. Alternatively, the insulation between the pixels may be achieved by an over-doping (P-type) relative to the layer 10, but such insulation is known to be less effective from both an electrical and an optical point of view. The spacing between the trench isolators 18 defines the size of the pixels.

In the case of a color sensor, color filters 19 are formed on the layer 16 in correspondence with the pixels. The filters 19 usually bear individual collimating lenses 20.

In operation, during an integration phase, the photons absorbed in the active layer, i.e. the region 10 of the photodiode, generate electrons that are stored in the region 14 of the photodiode. At the end of the integration phase, the stored charge is proportional to the amount of light received by the photodiode throughout the duration of the integration phase. After the integration phase, the stored charge is transferred through the transfer gate TG to the control elements.

A recurring problem of this pixel structure is the generation of carriers in the photodiode in the absence of light, causing a so-called dark current. The dark current is not the same for all pixels, or between two integration phases of the same pixel. This phenomenon produces a visible noise in the captured images, which is particularly conspicuous in low light conditions.

The origins of dark current are not well known. An identified source is the presence of defects or impurities in the semiconductor and the various interfaces between the active layer, region 10, and the insulating materials that surround it. The semiconductor material and the insulating material are not structurally equivalent, resulting in "construction" defects at the interfaces. All these defects are electrically active.

The interface defects may be neutralized by degenerating the semiconductor side of the silicon-insulator interface. Such a degeneration may be produced by over-doping the semiconductor side so that it has the same properties as a metal, in which the generation-recombination phenomena are balanced naturally. A perfect degeneration is difficult to achieve, whereby defects remain, but in smaller quantities.

In the case of a P-type active region 10, the electrons generated by interface defects diffuse to the storage region, i.e. region 14. These electrons participate in the dark current of the photodiode. To limit this phenomenon, interfaces that may present a poor surface state are neutralized, such as the interface between the trench isolators 18 and the layer 10. As shown, a P-type layer having a higher doping level than the active layer 10 may line the trench isolators 18. The doping level may be the same, P+, as the substrate. Thus, the generated electrons that can diffuse to the region 14 are less numerous. Despite these measures, a dark current may still remain an issue in front-side image sensors.

SUMMARY

In an embodiment, a front-side image sensor comprises a substrate that includes a semiconductor material, an active layer that includes a semiconductor material, an array of photodiodes formed in the active layer, and an insulating layer between the substrate and the active layer. The insulating layer may be a silicon oxide layer having a thickness selected to reflect photons in the visible range. The sensor may further comprise, between the insulating layer and the active layer, an intermediate layer of the same conductivity type as the active layer, having a higher doping level than the active layer.

In operation, the substrate may be biased at a voltage lower than that of the active layer. The substrate and the insulating layer may be an integral part of an SOI substrate. The sensor may further include a passivation layer on the active layer, an array of colored filters on the passivation layer, and an array of collimating lenses on the filter array.

A method aspect is directed to a method of producing a front-side image sensor and may include forming an active layer on an SOI substrate, forming a photodiode array in the active layer, and forming an array of color filters and collimating lenses on the active layer. The method may also include forming an intermediate layer on the insulating layer, of the same conductivity type as the active layer and having a doping level higher than the active layer.

DETAILED DESCRIPTION

The inventor has explored the assumption that an electron source contributing to the dark current in a front-side image sensor could also be the substrate. Indeed, although the substrate is P-doped, i.e. the majority carriers are positive, electrons generally always remain according to the relationship NpNn=ni2, where Np and Nn are the numbers of positive and negative carriers, respectively, and ni is the intrinsic concentration of the semiconductor material at a given temperature. The inventor theorizes, without intending to be bound thereto, that these negative carriers or electrons could under certain conditions migrate from the substrate to the active layer, even if the P-doping level of the active layer is lower than that of the substrate.

According to this assumption, the contribution of the substrate to the dark current could be reduced or eliminated by electrically isolating the active layer from the substrate. The insulation between the substrate and the active region may be implemented by forming the image sensor on a Silicon On Insulator (SOI) substrate.

Figure 1:
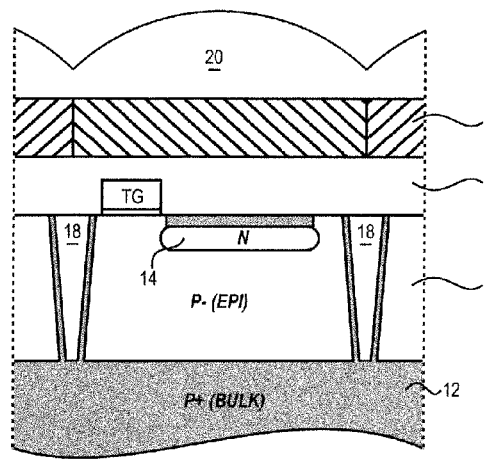
FIG. 1 is a schematic cross-section of a pixel of a front-side CMOS image sensor in accordance with the prior art.
Figure 2:
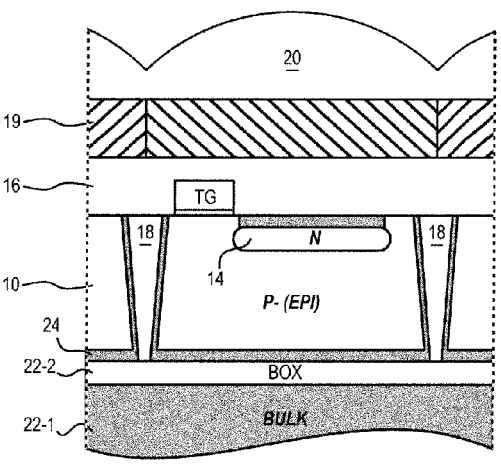
FIG. 2 is a schematic cross-section of an embodiment of a reduced dark current pixel according to the present invention.

FIG. 2 illustrates a resulting pixel of an image sensor. This pixel may be identical in all respects to that of FIG. 1, except that the substrate is an SOI substrate comprising a bulk region 22-1 in P-type silicon, covered by a silicon oxide layer 22-2.

The oxide layer 22-2 may have a thickness between 10 and 200 nm. By restricting the thickness range to 100-200 nm, this layer then acts as a mirror for photons having a wavelength around the visible spectrum. Incident photons thus reflected to the active layer contribute to charging the photodiode. This results in an increase of the pixel sensitivity.

Figure 3:
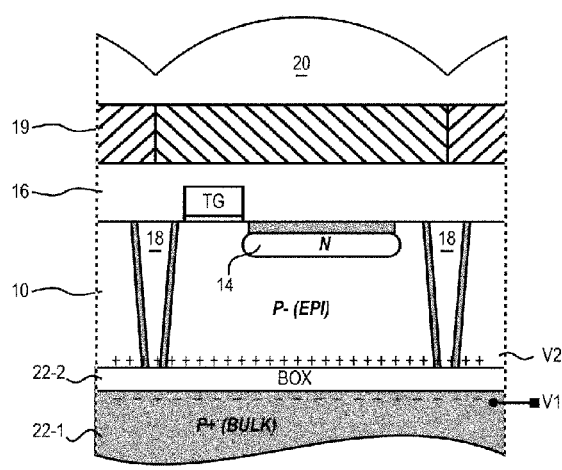
FIG. 3 is a schematic cross-section of another embodiment of a low dark current pixel according to an embodiment of the present invention.

FIG. 3 illustrates an alternative embodiment of the pixel of FIG. 2. The layer 22-2 is used as a dielectric of a capacitor. The substrate 22-1 is biased at a voltage V1 lower than the voltage of the active region 10, which is generally grounded. Then the voltage V1 applied is negative. In this case, the interface between the active region 10 and the oxide responds to voltage V1 by the accumulation at the interface of the majority carriers from the active region 10. The voltage induced by the positive charge accumulation at the interface between the active region 10 and the oxide will be designated V2 hereinafter and the voltage differential across the capacitor is thus V2−V1.

The voltage V1 to apply may depend on the thickness of the layer 22-2, so in fact on the value of the capacitor. Typically, the differential V2−V1 may range between 0.2 and 0.4 volt for a thickness of 20 nm, and range between 1.5 and 3 volts for a thickness of 150 nm.

The layer 24 of FIG. 2 and the capacitor configuration of FIG. 3 may be optional. These elements may be used to improve the results obtained through the insulating layer 22-2 alone, without applying the bias voltage V1. The inventor has observed that the insulating layer 22-2 used without these options already significantly reduces the effect of the substrate on the dark current.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A front-side image sensor comprising:
   a silicon-on-insulator (SOI) substrate comprising a semiconductor bulk region and an oxide insulating layer on an upper surface of said semiconductor bulk region;
   an active layer carried by the SOI substrate;
   an array of photodiodes in the active layer; and
   at least one trench isolator extending through said active layer to couple with an upper surface of said oxide insulating layer;
   said SOI substrate configured to be biased at a voltage lower than a voltage of the active layer during operation.

2. The front-side image sensor of claim 1, wherein the oxide insulating layer comprises a silicon oxide layer having a thickness in a range to reflect photons in a visible range.

3. The front-side image sensor of claim 1, further comprising an intermediate layer between the insulating layer and the active layer, the intermediate layer having a same conductivity type as the active layer and having a higher doping level than the active layer.

4. The front-side image sensor of claim 1, further comprising:
   a passivation layer carried by the active layer;
   an array of colored filters carried by the passivation layer; and
   an array of collimating lenses carried by the array of colored filters.

5. A front-side image sensor comprising:
   a silicon-on-insulator (SOI) substrate comprising a semiconductor bulk region and an oxide insulating layer on an upper surface of said semiconductor bulk region;
   an active layer carried by the SOI substrate;
   an array of photodiodes in the active layer; and
   at least one trench isolator extending completely through said active layer to couple with an upper surface of said oxide insulating layer.

6. The front-side image sensor of claim 5, wherein the oxide insulating layer comprises a silicon oxide layer having a thickness in a range to reflect photons in a visible range.

7. The front-side image sensor of claim 5, further comprising an intermediate layer between the insulating layer and the active layer, the intermediate layer having a same conductivity type as the active layer and having a higher doping level than the active layer.

8. The front-side image sensor of claim 5, wherein the SOI substrate is configured to be biased at a voltage lower than a voltage of the active layer during operation.

9. The front-side image sensor of claim 5, further comprising:
   a passivation layer carried by the active layer;
   an array of colored filters carried by the passivation layer; and
   an array of collimating lenses carried by the array of colored filters.

10. A front-side image sensor comprising:
    a silicon-on-insulator (SOI) substrate comprising a semiconductor bulk region and an oxide insulating layer on an upper surface of said semiconductor bulk region;
    an active layer carried by the SOI substrate;
    an array of photodiodes in the active layer; and
    at least one trench isolator extending through said active layer to contact an upper surface of said oxide insulating layer.

11. The front-side image sensor of claim 10, wherein the oxide insulating layer comprises a silicon oxide layer having a thickness in a range to reflect photons in a visible range.

12. The front-side image sensor of claim 10, further comprising an intermediate layer between the insulating layer and the active layer, the intermediate layer having a same conductivity type as the active layer and having a higher doping level than the active layer.

13. The front-side image sensor of claim 10, wherein the SOI substrate is configured to be biased at a voltage lower than a voltage of the active layer during operation.

14. The front-side image sensor of claim 10, further comprising:
- a passivation layer carried by the active layer;
- an array of colored filters carried by the passivation layer; and
- an array of collimating lenses carried by the array of colored filters.

* * * * *